(12) United States Patent
He et al.

(10) Patent No.: US 10,141,920 B2
(45) Date of Patent: *Nov. 27, 2018

(54) CLOCK SIGNAL CONTROLLER

(71) Applicant: INTERNATIONAL BUSINESS MACHINES CORPORATION, Armonk, NY (US)

(72) Inventors: Ou He, Beijing (CN); Yan S H He, Shanghai (CN); Wei A W Zhao, Shanghai (CN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 205 days.

This patent is subject to a terminal disclaimer.

(21) Appl. No.: 15/157,933

(22) Filed: May 18, 2016

(65) Prior Publication Data

US 2016/0269010 A1    Sep. 15, 2016

Related U.S. Application Data

(63) Continuation of application No. 14/542,944, filed on Nov. 17, 2014, now Pat. No. 9,374,073.

(30) Foreign Application Priority Data

Dec. 23, 2013    (CN) .......................... 2013 1 0717347

(51) Int. Cl.
*H03K 5/134* (2014.01)
*H03K 5/135* (2006.01)
*H03K 5/05* (2006.01)
*H03K 5/00* (2006.01)

(52) U.S. Cl.
CPC ............... *H03K 5/135* (2013.01); *H03K 5/05* (2013.01); *H03K 5/134* (2014.07); *H03K 2005/00019* (2013.01); *H03K 2005/00221* (2013.01); *H03K 2005/00234* (2013.01)

(58) Field of Classification Search
CPC ..................................................... H03K 5/134
See application file for complete search history.

(56) References Cited

U.S. PATENT DOCUMENTS

| 6,650,159 B2 | 11/2003 | Wang et al. |
| 7,526,666 B1 | 4/2009 | Soni |
| 7,671,634 B2 | 3/2010 | McCoy |
| 9,374,073 B2 * | 6/2016 | He .......................... H03K 5/134 |
| 2014/0203858 A1 | 7/2014 | Cho et al. |

FOREIGN PATENT DOCUMENTS

| CN | 1174459 | 2/1998 |
| CN | 101359302 | 2/2009 |

* cited by examiner

*Primary Examiner* — Hai L Nguyen
(74) *Attorney, Agent, or Firm* — Steven Meyers; Andrew M. Calderon; Roberts Mlotkowski Safran Cole & Calderon, P.C.

(57) ABSTRACT

The present invention provides a clock signal controller structure. The invention allows for the large-skew clock signals to be converted into small-skew clock signals. The technical solution of the present invention may be adopted to synchronize two large-skew clock signals.

12 Claims, 3 Drawing Sheets

CLOCK SIGNAL CONTROLLER

BACKGROUND

The present invention relates to a circuit technology, and more specifically, relates to a clock signal controller.

The quality of a clock signal determines the performance of an integrated circuit to a great extent. In a traditional design, a clock tree technology is employed to provide a clock signal. In the clock tree, an original clock signal is outputted from a clock source. Theoretically speaking, the clock signal may be directly provided to all elements using the clock signal, e.g., a register or a latch. However, actually, since the clock path is too long, the driving capability of the clock signal will be weakened. At this point, it needs addition of an inverter or buffer on the clock path, so as to enhance the driving capability of the clock signal. It would be appreciated that the driving capability of the enhanced clock signal might be weakened again, such that it needs re-addition of an inverter or buffer. From the perspective of the entire clock path, these added inverters or buffers form nodes in the tree structure.

Those skilled in the art would appreciate that propagation of the clock signal on the clock path has a delay. As aforementioned, on the clock path from the clock source to an element using the clock signal, there comprise a plurality of inverters or buffers. These inverters or buffers are one of important factors that cause the delay. The delay caused by inverters or buffers has a great uncertainty due to many factors such as the manufacturing process of the inverters or buffers, the operating temperature, the power source noise, and the like. Such uncertain delay greatly affects the performance of the integrated circuit. For example, for two elements adjacent on a data path, their clock signals may come from different clock paths; if the two clock signals are large-skew seriously, they cannot cooperate with each other. With the increasingly higher chip work frequency (i.e., the clock signal frequency), such adverse impact becomes more and more significant.

In order to overcome the above problem, a clock mesh technology is developed. The clock mesh technology realizes synchronization of the clock signals within a certain range of the chip. Specifically, with the clock mesh technology, a mesh structure may be formed within the range, and the clock signal on each point of this structure may be regarded as being small-skew. Correspondingly, each element within the range obtains nearby a clock signal from the mesh structure, such that these elements are driven by the small-skew clock signals.

For a large integrated circuit with complex functions, the clock mesh can only be realized at a local part of the chip from the perspective of power consumption and wiring. Besides, the clock mesh technology can only achieve a sound performance usually in the case that the range is of a regular shape. However, in many cases, a chip always includes many clock domains, and these clock domains do not have a regular shape. Therefore, it is hard to establish a corresponding clock mesh for these clock domains.

Hence, a new solution is desired to handle the issue of large-skew clock signals.

SUMMARY

Embodiments of the present invention provide a clock signal controller so as to change large-skew clock signals into small-skew clock signals.

A clock signal controller according to the embodiments of the present invention comprises: a first transistor, one of a source and a drain of the first transistor being connected to a working level, the other of the source and the drain being connected to a first connecting point, and a gate of the first transistor being connected to a first clock signal input end; a second transistor, one of a source and a drain of the second transistor being connected to a first connecting point, the other of the source and the drain being connected to a reference level, and a gate of the second transistor being connected to the first clock signal input end; a third transistor, one of a source and a drain of the third transistor being connected to the working level, the other of the source and the drain of the third transistor being connected to a second connecting point, and a gate of the third transistor being connected to a second clock signal input end; and a fourth transistor, one of a source and a drain of the fourth transistor being connected to the working level, the other of the source and the drain of the fourth transistor being connected to the second connecting point, and a gate of the fourth transistor being connected to the second clock signal input end; wherein the first connecting point and the second connecting point are connected to the first clock signal output end, wherein the first transistor and the second transistor are complementary-type transistors, and wherein the third transistor and the fourth transistor are complementary-type transistors.

A clock signal controller according to the embodiments of the present invention further comprises: a fifth transistor, one of a source and a drain of the fifth transistor being connected to the working level, the other of the source and the drain of the fifth transistor being connected to a third connecting point, and a gate of the fifth transistor being connected to the first clock signal input end; a sixth transistor, one of a source and a the drain of the sixth transistor being connected to the third connecting point, the other of the source and the drain of the sixth transistor being connected to the reference level, a gate of the sixth transistor being connected to the first clock signal input end; a seventh transistor, one of a source and a drain of the seventh transistor being connected to the working level, the other of the source and the drain of the seventh transistor being connected to a fourth connecting point, and a gate of the seventh transistor being connected to the second clock signal input end; and an eighth transistor, one of a source and a drain being connected to the working level, the other of the source and the drain of the eighth transistor being connected to the fourth connecting point, and a gate of the eighth transistor being connected to the second clock signal input end; the third connecting point and the fourth connecting point being connected to the second clock signal output end; one of the first clock signal output end and the second clock signal output end being connected, after being inverted, to one data signal input end of a data selector, and the other being connected to another data signal input end of the data selector, an output end of the data selector being connected to a clock input end of a D Flipflop, and a Q-pin of the D Flipflop being connected to the third clock signal output end. The Q-pin of the D Flipflop, after being inverted, is connected to D-pin of the D Flipflop and connected to the selected signal input end of the data selector; wherein the fifth transistor and the sixth transistor are complementary-type transistors, and wherein the seventh transistor and the eighth transistor are complementary-type transistors.

According to the technical solutions provided by the embodiments of the present invention, large-skew clock signals may be converted into small-skew clock signals.

BRIEF DESCRIPTION OF THE SEVERAL VIEWS OF THE DRAWINGS

Through the more detailed description of some embodiments of the present disclosure with reference to the accompanying drawings, the above and other objects, features and advantages of the present disclosure will become more apparent, wherein the same reference generally refers to the same components in the embodiments of the present disclosure.

DETAILED DESCRIPTION

Figure 1:
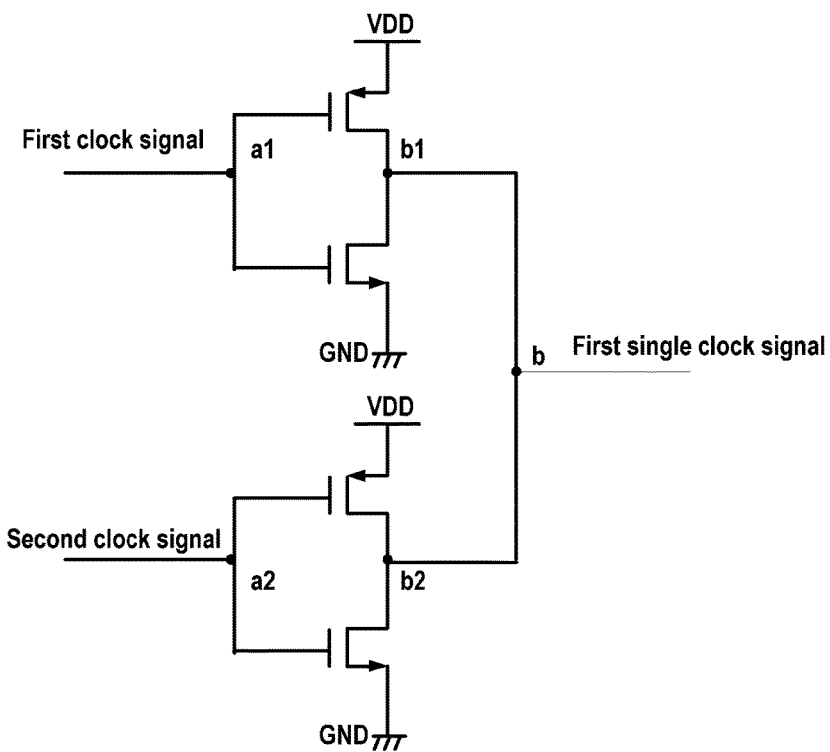
FIGS. 1, 3 and 4 show structures of a clock signal controller according to the embodiments of the present invention.

Hereinafter, the present invention will be described through specific embodiments with reference to the drawings. Such depiction is only for illustration purpose, not intended to limit the scope of the present invention. The drawings are provided for exemplary purposes and thus not drawn to scale. Besides, when the first element is described as being connected to the second element, the first element may not only be directly connected to the second element, but also be indirectly connected to the second element via a third element. Further, for the sake of clarity, some elements unnecessary for thoroughly understanding the present invention are omitted. In the drawings, like or corresponding elements are represented by like reference signs.

Those skilled in the art would appreciate that in a digital circuit, electrical level has a symmetrical relation with a device type. For example, the turn-on level of an N-type transistor is a high level, and the turn-on level of a P-type transistor is a low level. Thus, the conditions for high and low levels as involved in the following description may all vary with the change of the type of a related device. Besides, the conditions may also be varied by adding an extra device. For example, for a high-level turn-on N-type transistor, if an inversion device is added between the gate of an N-type transistor and an input signal, the transistor may be turned on when the input signal is a low level. For another example, when only the turn-on/turn-off feature of a transistor is utilized, the source and drain of the transistor may be exchangeable. These variations are equivalent to the embodiments of the present invention as depicted below and fall within the protection scope of the present patent.

FIG. 1 shows a structure of a clock signal controller according to the embodiments of the present invention.

As shown in FIG. 1, the clock signal controller according to the embodiments of the present invention comprises four transistors, wherein the first transistor is a P-type transistor, a source of the first transistor is connected to a working level, a drain of the first transistor is connected to a first connecting point b1, and a gate of the first transistor is connected to a first clock signal input end a1. A second transistor is an N-type transistor, a source of the second transistor is connected to the first connecting point b1, a drain of the second transistor is connected to a reference level, and a gate of the second transistor is connected to the first clock signal input end a1. The first connecting point is further connected to a first clock signal output end b.

A third transistor is a P-type transistor, a source of the third transistor is connected to the working level, a drain of the third transistor is connected to a second connecting point b2, and a gate of the third transistor is connected to a second clock signal input end a2. A fourth transistor is an N-type transistor, a source of the fourth transistor connected to the second connecting point b2, a drain of the fourth transistor is connected to the reference level, and a gate of the fourth transistor is connected to the second clock signal input end a2. The second connecting point is further connected to the first clock signal output end b.

It would be appreciated that the first transistor and the second transistor are complementary-type transistors, i.e., if the first transistor is one of an N-type transistor and a P-type transistor, the second transistor is the other type. Similarly, the third transistor and the fourth transistor are also complementary-type transistors. According to the embodiments of the present invention, it is the P-type transistor that is connected to the working level, and it is the N-type transistor that is connected to the reference level.

According to the embodiments of the present invention, the first transistor and the third transistor are of the same type, and the second transistor and the fourth transistor are of the same type, such that the pair of transistors connected to the first clock signal and the pair of transistors connected to the second clock signal have a better symmetry.

Through the structure shown in FIG. 1, the first clock signal and the second clock signal, which are large-skew, may be combined, so as to output a first single clock signal at the first clock signal output end b.

Hereinafter, the working principle of the structure shown in FIG. 1 will be depicted with reference to the waveform diagram of FIG. 2.

Figure 2:
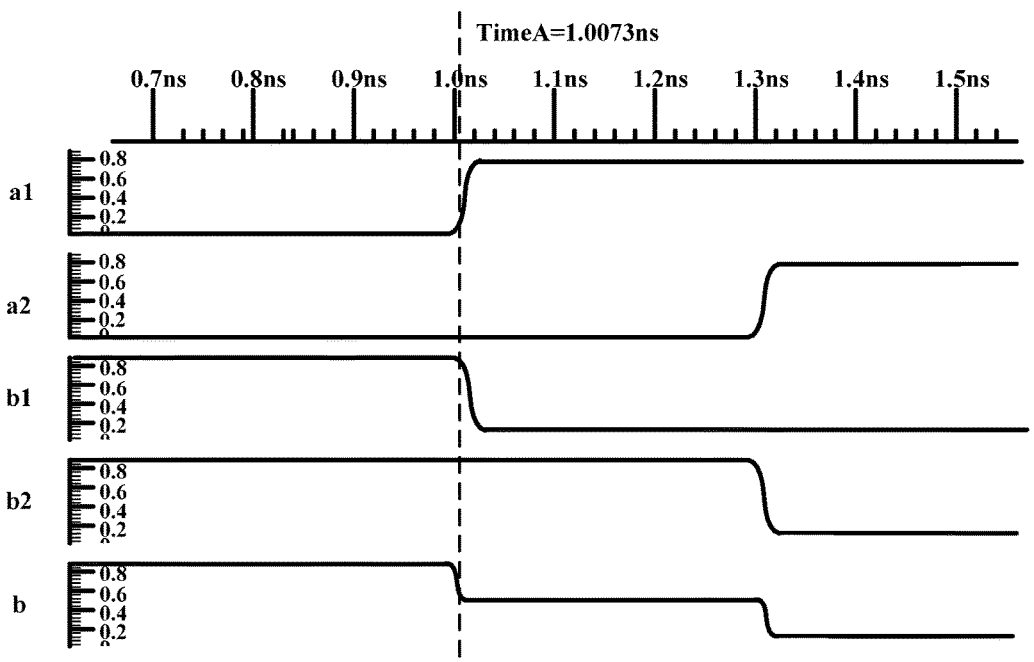
FIGS. 2, 5 and 6 show simulated waveform diagrams of a clock signal controller according to the embodiments of the present invention.

In FIG. 2, the horizontal axis is a time axis. FIG. 2 shows the waveforms of a1, a2, b1, b2, and b. It may be seen from the waveform diagrams of points a1 and a2 that the first clock signal and the second clock signal have a phase difference, i.e., being large-skew.

At time t1, both the first clock signal and the second clock signal are of a low level. At this point, the first and third transistors are turned on, while the second and fourth transistors are turn-off. Correspondingly, both points b1 and b2 are of a high level, such that point b is also of a high level.

At time t2, the first clock signal turns into a high level, while the second clock signal is still at a low level due to the existence of phase difference. At this point, the first transistor is turned off, while the second transistor is turned on; correspondingly, point b1 turns into a low level. Meanwhile, the third transistor is still turned on, and the fourth transistor is still turned off; therefore, point b2 is still at a high level. The level at point b lies between the high level and the low level.

At time t3, the first clock signal is still at a high level, while the second clock signal also turns into a high level. At this point, the first and third transistors are turned off, while the second and fourth transistors are turned on. Correspondingly, both points b1 and b2 turn into a low level, such that point b is also at a low level.

In the structure shown in FIG. 1, the inputted first clock signal and second clock signal have a phase difference, thereby having rising edges that are not aligned. The outputted first single clock signal has two trailing edges corresponding to the unaligned rising edges, respectively, and an intermediate level between the high level and the low level between the two trailing edges.

Those skilled in the art would appreciate that the clock signal should have either a high level or a low level; in one cycle, the clock signal should only have one rising edge and one trailing edge. If the above conditions are not satisfied, it is likely to cause misoperation of the element driven by the clock signal. In order to solve this problem, the four transistors shown in FIG. 1 require different driving capabilities.

As above mentioned, at time t2, the first connecting point b1 is of a low level, the second connecting point b2 is of a high level, and the level at the first clock signal output end b lies between the high level and the low level. If at the time t2, the low level signal of the first connecting point b1 is stronger than the high level signal of the second connecting point b2, the level of the first clock signal output end b is affected more seriously by the first connecting point b1, thereby approaching to the low level. In this way, the first trailing edge of point b will become more apparent, while the second trailing edge will become less apparent, such that the first single clock signal of point b may be approximately regarded as only having one trailing edge that is aligned to the rising edge of the first clock signal. Similarly, if at the time t2, the low level signal of the first connecting point b1 is weaker than the high level signal of the second connecting point b2, the level of the first clock signal output end b is affected more seriously by the second connecting point b2, thereby approaching to the high level. In this way, the second trailing edge of point b will become more apparent, while the first trailing edge will become less apparent, such that the first single clock signal of point b may be approximately regarded as only having one trailing edge that is aligned to the rising edge of the second clock signal.

In order to make the low level signal of the first connecting point b1 stronger than the high level signal of the second connecting point b2, in the structure shown in FIG. 1, the driving capability of the second transistor pulling down the first connecting point b1 to the reference level needs to be greater than the driving capability of the third transistor pulling up the second connecting point b2 to the working level. Similarly, in order to make the low level signal of the first connecting point b1 weaker than the high level signal of the second connecting point b2, in the structure shown in FIG. 1, the driving capability of the second transistor pulling down the first connecting point b1 to the reference level needs to be lower than the driving capability of the third transistor pulling up the second connecting point b2 to the working level. It belongs to customary means in the art how to enhance the driving capability of a transistor, which will not be detailed here.

What is depicted above with reference to FIG. 2 is how the structure shown in FIG. 1 processes the rising edges of the first and second clock signals. Since the rising edge of the first clock signal precedes the rising edge of the second clock signal, the trailing edge of the first clock signal will also precede the trailing edge of the second clock signal. Correspondingly, the first single clock signal of point b will have a first rising edge corresponding to the trailing edge of the first clock signal and a second rising edge corresponding to the trailing edge of the second clock signal; the first single clock signal lies between the first rising edge and the second rising edge and has an intermediate level between the high level and the low level.

According to one embodiment of the present invention, the driving capability of the pair of transistors connected to the first clock signal, as a whole, is symmetrical to the driving capability of the pair of transistors connected to the second clock signal, as a whole. In other words, if the driving capability of the second transistor is greater than the driving capability of the third transistor, the driving capability of the first transistor is lower than the driving capability of the fourth transistor. In this case, for the period of time between the trailing edge of the first clock signal and the trailing edge of the second clock signal, the driving capability of the first transistor pulling up the first connecting point b1 to the working level is lower than the driving capability of the fourth transistor pulling down the second connecting point b2 to the reference level, then the high level signal of the first connecting point b1 is weaker than the low level signal of the second connecting point b2, such that the first rising edge of the first single clock signal becomes not apparent, while the second rising edge becomes more apparent.

On the contrary, if the driving capability of the second transistor is lower than the driving capability of the third transistor, in order to achieve the symmetric driving capability, the driving capability of the first transistor should be greater than the driving capability of the fourth transistor. In this case, for the period of time between the trailing edge of the first clock signal and the trailing edge of the second clock signal, the driving capability of the first transistor pulling up the first connecting point b1 to the working level is greater than the driving capability of the fourth transistor pulling down the second connecting point b2 to the reference level, then the high level signal of the first connecting point b1 is stronger than the low level signal of the second connecting point b2, such that the first rising edge becomes more apparent, while the second rising edge becomes not apparent.

It is seen from the above analysis that if the driving capability of the pair of transistors connected to the first clock signal, as a whole, is symmetric to the driving capability of the pair of transistors connected to the second clock signal, as a whole, then the duty ratio of the first single clock signal will change relative to both the first clock signal and the second clock signal. For example, if the driving capability of the first transistor is greater than the driving capability of the fourth transistor, and the driving capability of the second transistor is lower than the driving capability of the third transistor, the trailing edge of the first single clock signal at point b corresponds to the rising edge of the second clock signal, while the rising edge of the first single clock signal corresponds to the trailing edge of the first clock signal. On the contrary, if the driving capability of the first transistor is lower than the driving capability of the fourth transistor, and the driving capability of the second transistor is greater than the driving capability of the third transistor, the trailing edge of the first single clock signal at point b corresponds to the rising edge of the first clock signal, while the rising edge of the first single clock signal corresponds to the trailing edge of the second clock signal. In either case, the duty ratio of the first single clock signal will change.

If the rising edge and the trailing edge of the first single clock signal at point b are aligned to the trailing edge and the rising edge of the first clock signal, respectively, then the driving capabilities of the first and second transistors directly connected to the first clock signal should be greater than the driving capabilities of the fourth and third transistors directly connected to the second clock signal, respectively. On the contrary, if the rising edge and the trailing edge of the first single clock signal at point b are aligned to the trailing edge and the rising edge of the second clock signal, respectively, the driving capabilities of the first and second transistors directly connected to the first clock signal should be lower than the driving capabilities of the fourth and third transistors directly connected to the second clock signal, respectively. Therefore, according to another embodiment of the present invention, the driving capability of the pair of transistors connected to the first clock signal, as a whole, is symmetrical to the driving capability of the pair of transistors connected to the second clock signal, as a whole.

However, such a clock controller structure will cause the first single clock signal of point b to fixedly follow one of the first clock signal and the second clock signal, regardless of whether the particular one is a fast clock signal or a slow clock signal. As previously mentioned, the delay on the clock path has uncertainty. It is possible that during a certain period when the chip works, the first clock signal is faster than the second clock signal; during another period when the chip works, the first clock signal is slower than the second clock signal. Therefore, fixedly following one of the first clock signal and the second clock signal will result in that the first single clock signal follows a faster input clock signal during a certain period, while follows a slower input clock signal during another period. Such a single first clock signal driving will cause an adverse impact on the operation of the element driven thereby.

Besides, as previously mentioned, the first single clock signal has two rising edges and two trailing edges corresponding to the first clock signal and the second clock signal, respectively. Although one of the two rising edges/two trailing edges may become apparent and the other becomes not apparent through adjusting the driving capability of the transistor, unless the difference between driving capabilities of two transistors that have driving capabilities is enormously large, two ineligible rising edges and two ineligible trailing edges would still appear in the first single clock signal. It is highly demanding for the chip manufacturing process to realize transistors with enormously great driving capability difference on a very close distance.

Figure 3:
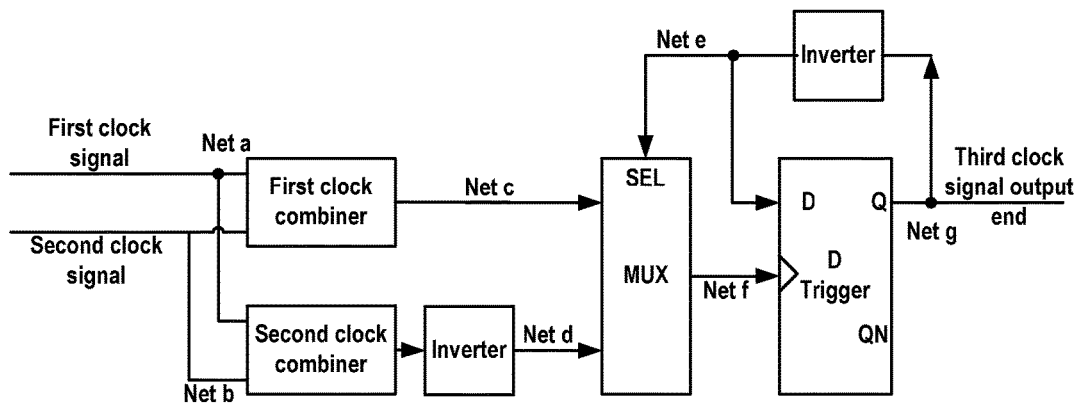

FIG. 3 shows a structure of a clock signal controller according to another embodiment of the present invention.

The basic structure of the clock controller according to the embodiments of the present invention has been described above with reference to FIG. 1, and the first clock combiner and the second clock combiner in FIG. 3 have the structure shown in FIG. 1.

Specifically, the first clock combiner has first through four transistors. Here, the first transistor is a P-type transistor, a source of the first transistor is connected to the working level, a drain of the first transistor is connected to a first connecting point, and a gate of the first transistor is connected to a first clock signal input end. A second transistor is an N-type transistor, a source of the second transistor is connected to the first connecting point, a drain of the second transistor is connected to a reference level, and a gate of the second transistor is connected to the first clock signal input end. The first connecting point is further connected to a first clock signal output end.

The third transistor is a P-type transistor, a source of the third transistor is connected to the working level, a drain of the third transistor is connected to a second connecting point, and a gate of the third transistor is connected to a second clock signal input end. A fourth transistor is an N-type transistor, a source of the fourth transistor is connected to the second connecting point, a drain of the fourth transistor is connected to the reference level, and a gate of the fourth transistor is connected to the second clock signal input end. The second connecting point is further connected to a first clock signal output end.

In the first clock combiner, the driving capability of the N-type transistor (i.e., the second transistor) connected to the first clock signal is greater than the driving capability of the P-type transistor (i.e., the third transistor) connected to the second clock signal, and the driving capability of the P-type transistor (i.e., the first transistor) connected to the first clock signal is lower than the driving capability of the N-type transistor (i.e., the fourth transistor) connected to the second clock signal. It may be seen from the above analysis that given the first clock signal being faster than the second clock signal, the trailing edge of the first single clock signal outputted by the first clock combiner corresponds to the rising edge of the first clock signal, and its rising edge corresponds to the trailing edge of the second clock signal.

The second clock combiner has fifth through eighth transistors. Here, the fifth transistor is a P-type transistor, a source of the fifth transistor is connected to the working level, a drain of the fifth transistor is connected to a third connecting point, and a gate of the fifth transistor is connected to the first clock signal input end. A sixth transistor is an N-type transistor, a source of the sixth transistor is connected to the third connecting pint, a drain of the sixth transistor is connected to the reference level, and a gate of the sixth transistor is connected to the first clock signal input end. The first connecting pint is further connected to a second clock signal output end.

A seventh transistor is a P-type transistor, a source of the seventh transistor is connected to the working level, a drain of the seventh transistor is connected to the second connecting point, and a gate of the seventh transistor is connected to the second clock signal input end. An eighth transistor is an N-type transistor, a source of the eighth transistor is connected to the second connecting point, a drain of the eighth transistor is connected to the reference level, and a gate of the eighth transistor is connected to the second clock signal input end. The second connecting point is further connected to a second clock signal output end.

In the second clock combiner, the driving capability of the N-type transistor (i.e., the sixth transistor) connected to the first clock signal is lower than the driving capability of the P-type transistor (i.e., the seventh transistor) connected to the second clock signal, and the driving capability of the P-type transistor (i.e., the fifth transistor) connected to the first clock signal is greater than the driving capability of the N-type transistor (i.e., the eighth transistor) connected to the second clock signal. It may be seen from the above analysis that given the first clock signal being faster than the second clock signal, the trailing edge of the second single clock signal outputted by the first clock combiner corresponds to the rising edge of the second clock signal, and its rising edge corresponds to the trailing edge of the first clock signal.

In FIG. 3, the first clock signal output end is connected to a data signal input end of a data selector, the second clock signal output end, after being inverted, is connected to another data signal input end of the data selector, and the output end of the data selector is connected to the clock input end of a D Flipflop. When the selected signal of the data selector is of a high level, the data selector selects the first clock signal as an output; on the contrary, when the selected signal is of a low level, the data selector selects the inverted second clock signal as an output.

In other words, the signal of one data signal input end of the data selector has a trailing edge corresponding to the rising edge of the first clock signal, and has a rising edge corresponding to the trailing edge of the second clock signal. The signal of another data signal input end of the data selector has a rising edge corresponding to the rising edge of the second clock signal, and has a trailing edge corresponding to the trailing edge of the first clock signal.

A Q-pin of the D Flipflop is connected to the output end of the third clock signal. The Q-pin of the D Flipflop, after being inverted, is connected to a D-pin of the D Flipflop and connected to the selected signal input end of the data selector.

Those skilled in the art would appreciate that the working principle of the D Flipflop is outputting, at the Q-pin, the signal value of the D-pin at each rising edge of the clock. In FIG. 3, the signal of the Q-pin, after being inverted, is in turn connected to the D-pin. Therefore, the signal of the third clock signal output end actually flips once at the rising edge of each clock.

On the other hand, the signal of the third clock signal output end is in turn connected to the selected signal input end of the data selector. In other words, when the signal of the third clock signal output end is either of a high level or a low level, the data selector selects to output the first single clock signal; when the signal of the third clock signal output end is the other of the high level and low level, the data selector selects to output the second single clock signal. In FIG. 3, the selected signal enables the data selector to output the second single clock signal when the second clock signal has a rising edge, and output the first single clock signal when the first clock signal has a rising edge.

Since the second single clock signal has a rising edge corresponding to the rising edge of the second clock signal, while the first single clock signal has the rising edge corresponding to the trailing edge of the second clock signal. Thus, in the structure shown in FIG. 3, the output end of the data selector has two rising edges corresponding to the rising edge and the trailing edge of the second clock signal, respectively. As above mentioned, the signal of the output end of the D Flipflop (i.e., the third clock signal output end) actually flips once at the rising edge of each clock. Therefore, the rising edge of the signal of the third clock signal output end corresponds to one of the rising edge and the trailing edge of the second clock signal, and the trailing edge of the second clock signal corresponds to the other of the rising edge and trailing edge of the second clock signal. Accordingly, the duty ratio of the signal of the third clock signal output end is identical to the duty ratio of the original first clock signal or second clock signal.

The above depiction is based on the assumption that the first clock signal is faster than the second clock signal. Based on the depiction, those skilled in the art would conclude that when the second clock signal is faster than the first clock signal, the rising edge of the signal of the third clock signal output end corresponds to one of the rising edge and trailing edge, and the trailing edge of the third clock signal corresponds to corresponds to the other of the rising edge and trailing edge of the first clock signal. Therefore, the signal of the third clock signal output end follows the slower one of the first and second clock signals.

Figure 4:
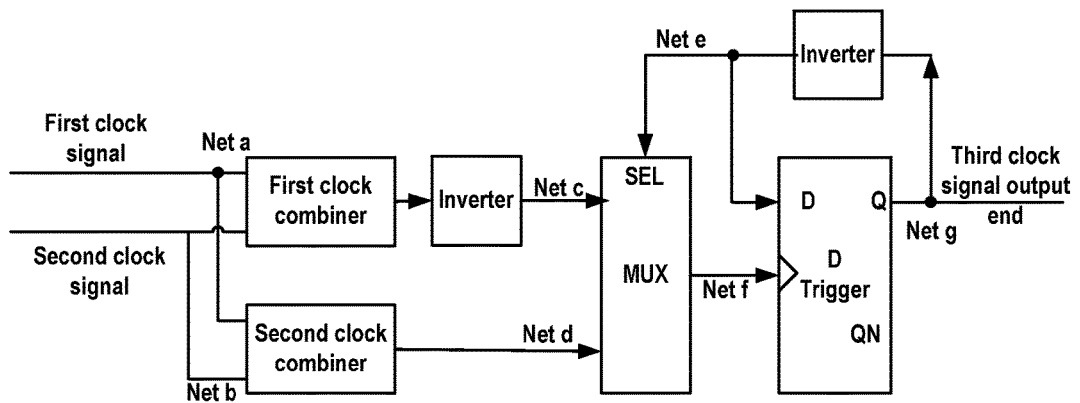

If it is desired that the signal of the third clock signal output end follows the faster one of the first and second clock signals, the structure as shown in FIG. 4 may be adopted. In FIG. 4, the output of the first clock combiner, after being inverted, is connected to one input of the data selector, and the output of the second clock combiner is connected to another input of the data selector. When the selected signal of the data selector is of a high level, the data selector selects the inverted first clock signal as an output; on the contrary, when the selected signal is of a low level, the data selector selects the second clock signal as an output.

Figure 5:
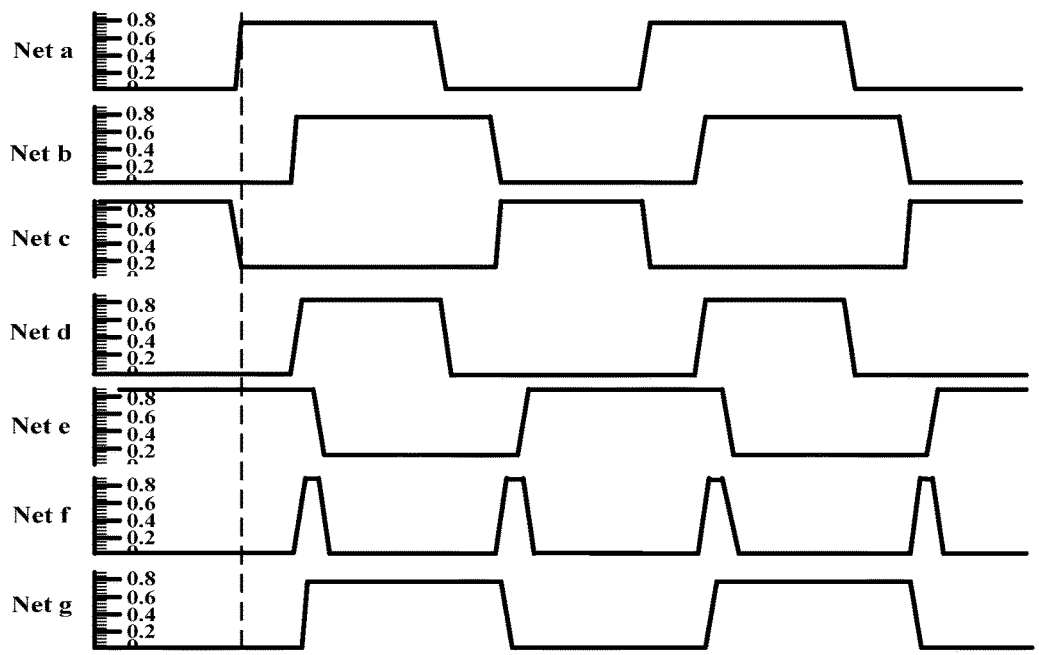
Figure 6:
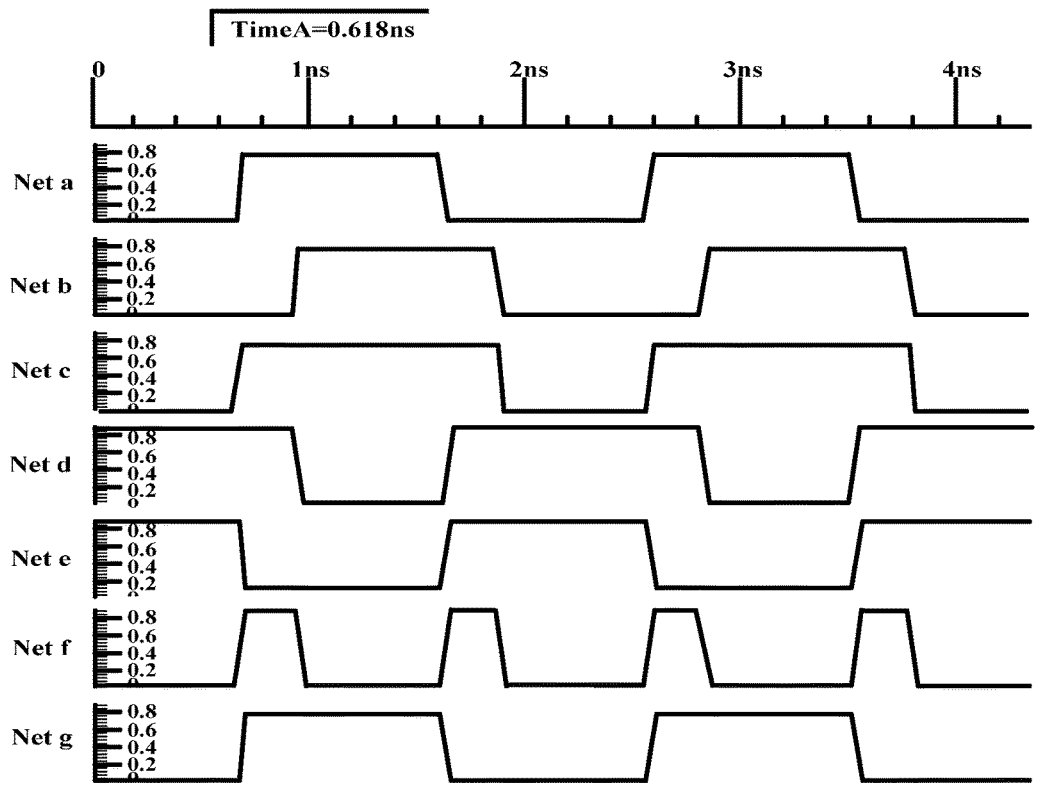

FIGS. 5 and 6 are waveform diagrams derived from simulation of the circuits in FIG. 3 and FIG. 4. It is seen from FIG. 5 that the second clock signal (Net b) is slower than the first clock signal (Net a). The signal (Net g) of the third clock signal output end is synchronized with the second clock signal. It is seen from FIG. 6 that the second clock signal (Net b) is still slower than the first clock signal (Net a), and the signal (Net g) of the third clock signal output end is still synchronized with the first clock signal. The duty ratio of the signal of the third clock signal output end is identical to that of the first and second clock signals. The signal of the third clock signal output end does not have a terraced rising edge or trailing edge like the single clock signal (b) in FIG. 2.

Those skilled in the art would appreciate that the modern integrated circuit is usually designed in a layered manner. In other words, the entire integrated circuit is first partitioned into a plurality of modules; each functional module is further divided into a plurality of lower modules; each sub-module is further divided into even lower modules, till realization of the element level. The design layer realized close to the element level is called a low-hierarchy design, while the design layer realized far away from the element level is called a high-hierarchy design.

The inventors of the present invention find that the requirement on the clock signal is relatively high in the high-hierarchy design, which not only requires synchronization between clock signals of each module, but also requires the duty ratio for the clock signals of each high-hierarchy module to be identical. In the low-hierarchy design, the requirement on the clock signal is relatively low, which only requires guaranteeing synchronization between clock signals. According to the embodiments of the present invention, the structures as shown in FIGS. 3 and 4 may be adopted in the high-hierarchy design, and the structure as shown in FIG. 1 may be adopted in the low-hierarchy design. In other words, the complex structure as shown in FIG. 3 and FIG. 4 is only adopted for the clock synchronization between high-hierarchy modules, while for clock synchronization between the low-hierarchy modules inside these top-layer modules, the simple structure shown in FIG. 1 may be adopted, rather than the complex structure shown in FIGS. 3 and 4. Those skilled in the art would appreciate that the number of top-layer modules is far less than the number of low-hierarchy modules. This not only satisfies the requirement on the clock signal, but also saves the integrated circuit resource.

From the perspective of the clock tree, the clock tree node that supplies power to the top-layer modules is always close to the root node of the clock tree, while the clock tree node that supplies power to the low-hierarchy modules is always close to the leaf nodes of the clock tree. According to the embodiments of the present invention, when the clock signals outputted by two clock tree nodes close to the root nodes are synchronized, the complex structures shown in FIG. 3 and FIG. 4 are adopted; when the clock signals outputted by two clock tree nodes close to leaf nodes are synchronized, the simple structure as shown in FIG. 1 is adopted. Those skilled in the art would appreciate that in the clock tree, the number of nodes close to the root node is far less than the number of nodes close to the leaf nodes. Therefore, adoption of such a strategy can likewise satisfy the requirements on the clock signal while saving the integrated circuit resource.

Although various devices according to the present invention have been described in detail with reference to the preferred embodiments, the present invention is not limited to this. A person of normal skill in the art can make various changes, alterations and modifications to the present invention under the teaching of the description without departing from the spirit and scope of the present invention. It should be understood that all such changes, alterations, and modifications still fall into the protection scope of the present invention. The protection scope of the present invention is defined by the appending claims.

The invention claimed is:

1. A clock signal controller, comprising:
   a first transistor being connected to a working level and a first connecting point, and a gate of the first transistor being connected to a first clock signal input end;
   a second transistor being connected to a first connecting point and to a reference level, and a gate of the second transistor being connected to the first clock signal input end;
   a third transistor being connected to the working level and to a second connecting point, and a gate of the third transistor being connected to a second clock signal input end; and
   a fourth transistor being connected to the working level and the second connecting point, and a gate of the fourth transistor being connected to the second clock signal input end;
   wherein the first connecting point and the second connecting point are connected to a first clock signal output end.

2. The clock signal controller according to claim 1, wherein the first transistor and the third transistor are transistors of the same type, and the second transistor and the fourth transistor are transistors of the same type.

3. The clock signal controller according to claim 2, wherein a driving capability of the first transistor is greater than a driving capability of the fourth transistor.

4. The clock signal controller according to claim 3, wherein a driving capability of the second transistor is lower than a driving capability of the third transistor.

5. The clock signal controller according to claim 3, further comprising:
   a fifth transistor, one of a source and a drain of the fifth transistor being connected to a working level, the other of the source and the drain of the fifth transistor being connected to a third connecting point, and a gate of the fifth transistor being connected to the first clock signal input end;
   a sixth transistor, one of a source and a drain of the sixth transistor being connected to the third connecting point, the other of the source and the drain of the sixth transistor being connected to the reference level, and a gate of the sixth transistor being connected to the first clock signal input end;
   a seventh transistor, one of a source and a drain of the seventh transistor being connected to the working level, the other of the source and the drain of the seventh transistor being connected to a fourth connecting point, and a gate of the seventh transistor being connected to the second clock signal input end; and
   an eighth transistor, one of a source and a drain of the eighth transistor being connected to the working level, the other of the source and the drain of the eighth transistor being connected to the fourth connecting point, and a gate of the eighth transistor being connected to the second clock signal input end;
   the third connecting point and the fourth connecting point being connected to a second clock signal output end;
   one of the first clock signal output end and the second clock signal output end being connected, after being inverted, to one data signal input end of a data selector, and the other of the first clock signal output end and the second clock signal output end being connected to another data signal input end of the data selector, an output end of the data selector being connected to a clock input end of a D Flipflop, and a Q-pin of the D Flipflop being connected to a third clock signal output end; the Q-pin of the D Flipflop, after being inverted, being connected to a D-pin of the D Flipflop and connected to the selected signal input end of the data selector;
   wherein the fifth transistor and the sixth transistor are complementary type transistors, and wherein the seventh transistor and the eighth transistor are complementary type transistors.

6. The clock signal controller according to claim 5, wherein the fifth transistor and the seventh transistor are transistors of the same type, and are of the same type as the first and third transistors; the sixth transistor and the eighth transistor are transistors of the same type, and are of the same type as the second and fourth transistors.

7. The clock signal controller according to claim 6, wherein a driving capability of the fifth transistor is lower than a driving capability of the eighth transistor, and wherein a driving capability of the sixth transistor is greater than a driving capability of the seventh transistor.

8. The clock signal controller according to claim 7, wherein the clock signal controller is used for clock synchronization between high-hierarchy modules of an integrated circuit.

9. The clock signal controller according to claim 7, wherein the transistors connected to the working level are P-type transistors, and the transistors connected to the reference level are N-type transistors.

10. The clock signal controller according to claim 3, wherein a driving capability of the first transistor is greater than a driving capability of the fourth transistor, and wherein a driving capability of the second transistor is greater than a driving capability of the third transistor.

11. The clock signal controller according to claim 1, wherein the clock signal controller is used for clock synchronization between low-hierarchy modules of an integrated circuit.

12. The clock signal controller according to claim 1, wherein the transistors connected to the working level are P-type transistors, and the transistors connected to the reference level are N-type transistors and wherein the first transistor and the second transistor are complementary type transistors, and wherein the third transistor and the fourth transistor are complementary type transistors.

* * * * *